(12) United States Patent
Becker et al.

(10) Patent No.: US 12,125,817 B2
(45) Date of Patent: Oct. 22, 2024

(54) SEMICONDUCTOR MODULE WITH A FIRST SUBSTRATE, A SECOND SUBSTRATE AND A SPACER SEPARATING THE SUBSTRATES FROM EACH OTHER

(71) Applicant: Danfoss Silicon Power GmbH, Flensburg (DE)

(72) Inventors: Martin Becker, Flensburg (DE); André Bastos Abibe, Flensburg (DE); Ronald Eisele, Flensburg (DE); Jacek Rudzki, Flensburg (DE); Frank Osterwald, Flensburg (DE); David Benning, Flensburg (DE)

(73) Assignee: DANFOSS SILICON POWER GMBH, Flensburg (DE)

(*) Notice: Subject to any disclaimer, the term of this patent is extended or adjusted under 35 U.S.C. 154(b) by 397 days.

(21) Appl. No.: 17/608,856

(22) PCT Filed: May 6, 2020

(86) PCT No.: PCT/EP2020/062628
§ 371 (c)(1),
(2) Date: Nov. 4, 2021

(87) PCT Pub. No.: WO2020/225329
PCT Pub. Date: Nov. 12, 2020

(65) Prior Publication Data
US 2022/0302073 A1 Sep. 22, 2022

(30) Foreign Application Priority Data
May 8, 2019 (DE) .......................... 102019111964.2

(51) Int. Cl.
*H01L 23/00* (2006.01)
*H01L 23/498* (2006.01)

(52) U.S. Cl.
CPC ........ *H01L 24/40* (2013.01); *H01L 23/49833* (2013.01); *H01L 24/29* (2013.01);
(Continued)

(58) Field of Classification Search
CPC ... H01L 24/40; H01L 23/49833; H01L 24/29; H01L 24/32; H01L 24/48; H01L 24/73;
(Continued)

(56) References Cited

U.S. PATENT DOCUMENTS

| | | | |
|---|---|---|---|
| 2002/0005578 A1* | 1/2002 | Kodama | ................. H01L 24/72 257/718 |
| 2003/0132041 A1* | 7/2003 | Beihoff | ................... B60L 50/15 180/65.1 |

(Continued)

FOREIGN PATENT DOCUMENTS

| | | |
|---|---|---|
| CN | 104779228 A | 7/2015 |
| DE | 10 2014 219 585 A1 | 3/2016 |

(Continued)

OTHER PUBLICATIONS

International Search Report for PCT/EP2020/062628 Dated Aug. 7, 2020.
(Continued)

*Primary Examiner* — Robert G Bachner
(74) *Attorney, Agent, or Firm* — McCormick, Paulding & Huber PLLC

(57) ABSTRACT

Semiconductor module having a first substrate, a second substrate and a spacer distancing the substrates from each other, wherein the spacer is formed by at least one elastic shaped metal body.

24 Claims, 3 Drawing Sheets

(52) U.S. Cl.
CPC .............. *H01L 24/32* (2013.01); *H01L 24/48* (2013.01); *H01L 24/73* (2013.01); *H01L 24/83* (2013.01); *H01L 24/84* (2013.01); *H01L 24/85* (2013.01); *H01L 2224/29139* (2013.01); *H01L 2224/32225* (2013.01); *H01L 2224/32245* (2013.01); *H01L 2224/4001* (2013.01); *H01L 2224/40091* (2013.01); *H01L 2224/40095* (2013.01); *H01L 2224/40225* (2013.01); *H01L 2224/48011* (2013.01); *H01L 2224/48245* (2013.01); *H01L 2224/73213* (2013.01); *H01L 2224/73221* (2013.01); *H01L 2224/73263* (2013.01); *H01L 2224/8384* (2013.01); *H01L 2224/8484* (2013.01); *H01L 2224/85203* (2013.01); *H01L 2924/10272* (2013.01); *H01L 2924/351* (2013.01); *H01L 2924/37001* (2013.01)

(58) Field of Classification Search
CPC ......... H01L 24/83; H01L 24/84; H01L 24/85; H01L 2224/29139; H01L 2224/32225; H01L 2224/32245; H01L 2224/4001; H01L 2224/40091; H01L 2224/40095; H01L 2224/40225; H01L 2224/48011; H01L 2224/48245; H01L 2224/73213; H01L 2224/73221; H01L 2224/73263; H01L 2224/8384; H01L 2224/8484; H01L 2224/85203; H01L 2924/10272; H01L 2924/351; H01L 2924/37001; H01L 23/49517; H01L 24/05; H01L 24/33; H01L 2224/04026; H01L 2224/05624; H01L 2224/2612; H01L 2224/29005; H01L 2224/29011; H01L 2224/29012; H01L 2224/29015; H01L 2224/29016; H01L 2224/29017; H01L 2224/29018; H01L 2224/29019; H01L 2224/29144; H01L 2224/29147; H01L 2224/29155; H01L 2224/29169; H01L 2224/29294; H01L 2224/29339; H01L 2224/33181; H01L 2224/4813; H01L 2224/4846; H01L 2224/73265; H01L 2224/83191; H01L 2224/83193; H01L 2224/83201; H01L 2224/83203; H01L 2224/83209; H01L 2924/00014; H01L 2224/32227; H01L 2224/838; H01L 2224/83022; H01L 2224/83901; H01L 23/3735; H01L 23/49537; H01L 24/34; H01L 2224/4105; H01L 2224/84365

See application file for complete search history.

(56) References Cited

U.S. PATENT DOCUMENTS

| | | | |
|---|---|---|---|
| 2003/0168252 A1 | 9/2003 | Schmid et al. | |
| 2008/0224282 A1* | 9/2008 | Ashida | H01L 23/49575 257/E23.044 |
| 2012/0164767 A1 | 6/2012 | Gasse et al. | |
| 2017/0365583 A1 | 12/2017 | Im et al. | |
| 2019/0214369 A1* | 7/2019 | Seidemann | H01L 23/00 |
| 2019/0371703 A1 | 12/2019 | Matsuzaki et al. | |

FOREIGN PATENT DOCUMENTS

| | | |
|---|---|---|
| DE | 10 2014 222 819 A1 | 5/2016 |
| EP | 2372763 A2 | 10/2011 |
| JP | 2006-294882 A | 10/2006 |
| JP | 2007042738 A | 2/2007 |
| JP | 2012-142622 A | 7/2012 |
| TW | 200725853 A | 7/2007 |
| WO | 2017218968 A2 | 12/2017 |
| WO | 2019053840 A1 | 3/2019 |

OTHER PUBLICATIONS

Office Action issued for German Patent Application Serial No. 10 2019 111 964.2, dated Jul. 18, 2022 and a machine translation of the claims.

* cited by examiner

SEMICONDUCTOR MODULE WITH A FIRST SUBSTRATE, A SECOND SUBSTRATE AND A SPACER SEPARATING THE SUBSTRATES FROM EACH OTHER

CROSS-REFERENCE TO RELATED APPLICATION

This application is a National Stage application of International Patent Application No. PCT/EP2020/062628, filed on May 6, 2020, which claims priority to German Application No. 102019111964.2 filed on May 8, 2019, each of which is hereby incorporated by reference in its entirety.

TECHNICAL FIELD

The invention relates to a semiconductor module with a first substrate, a second substrate and a spacer separating the substrates from each other.

BACKGROUND

When a sandwich structure is used to produce semiconductor modules, separators usually referred to as "spacers" are installed, which provide the voltage-carrying surfaces for a predetermined minimum distance between the substrates, in particular when using direct copper bonding ("DCB") substrates. These spacers are usually soldered, whereby the thermomechanical stress that acts when connecting to the semiconductor is low.

The disadvantage of this approach is that the reliability of the connection of this stack is limited by the soldered connections. If, instead of the soldering process, pressure sintering technology is used as an alternative, high thermomechanical forces, which could lead to fractures in the semiconductors, would arise due to the stiff sintered connections.

There is a gap of about 0.5 to 4 mm (depending on the voltage class) between the upper substrate and chip service that has to be filled. If such a bulk copper body were sintered onto the semiconductor, it is observed that conchoidal fractures are likely to arise in the semiconductor body. Experience shows that it is impossible to make the Cu layer (sintered directly onto the chip) significantly thicker than about 60-75 µm.

SUMMARY

It is therefore an object of the present invention to provide a semiconductor module having higher durability and reliability than conventionally fabricated semiconductor modules.

This object is achieved, according to the invention, by the semiconductor module having the features of claim 1. The object is also achieved by the method having the features of claim 24. The dependent claims respectively render advantageous embodiments of the invention.

The basic idea of the invention is to configure the spacer as an electrically conductive, elastic element which can concurrently break up oxidized surfaces via elastic compensatory movements and thus provides for the electrical connection between two substrates, which can also possibly be made of base metal.

According to the invention, a semiconductor module having a first substrate, a second substrate and a spacer distancing the substrates from each other is thus provided, wherein the spacer is made of at least one elastic shaped metal body.

A semiconductor is preferably disposed between the first substrate and the second substrate, with the semiconductor particularly preferably being firmly bonded to the one substrate. The semiconductor is most preferably in electrical contact with the other substrate via the shaped metal body.

The first substrate and/or the second substrate is preferably a DCB substrate. Alternatively, the first substrate and/or the second substrate may comprise a lead frame.

The shaped metal body is in particular configured so that an expansion of the shaped metal body in a second direction is produced upon applying a pressure acting in a first direction.

It is furthermore preferable for the semiconductor module to have a plurality of shaped metal bodies mutually oriented in different directions.

The shaped metal body is preferably configured to yield laterally when a pressure from a substrate applied in the direction of the semiconductor acts substantially vertically on the semiconductor.

According to a further preferred embodiment, the shaped metal body is disposed in a planar manner on the semiconductor, in the plane between the substrates.

The shaped metal body may preferably be curved. In particular, the shaped metal body may be folded. Specifically, the shaped metal body may be wave-shaped in cross-section.

In addition, the shaped metal body may be slotted, with the slots introduced into the shaped metal body in particular being disposed symmetrically. The slots introduced into the shaped metal body are particularly preferably disposed transverse to their bends, folds or their wavy configuration. This embodiment not only allows for an elastic deformation in the direction of the crests and troughs of the elastically configured spacer, but also transverse to the bending, folding or wavy configuration.

The deflected portions of the curved, braided or folded shaped metal body are configured to contact the semiconductor and the other substrate electrically.

Furthermore, the shaped metal body is preferably configured as a film.

The shaped metal body is in particular connected to the semiconductor and to the other substrate by sintering.

Alternatively, the shaped metal body is in particular connected to the semiconductor and to the other substrate by the use of nanowires. In this technique, nanowires may be grown from one or more of the surfaces to be connected, and then the surfaces are brought together. The joining takes place under compression and possibly with a raised temperature. However, the technique is admirably suited to the current invention, since it can successfully be used with relatively low pressures, thus enabling the connection of components utilizing the shaped metal body without damaging the elastic properties of the shaped metal body. The pressure used for bonding may be up to 70 MPa, but in some situations it may be as low as 1 MPa. The nanowires may typically comprise copper or gold, nickel, silver, platinum, or other suitable metals. Typically they may have a diameter of between 30 nm and 2 µm and have a length of between 500 nm and 50 µm.

According to a further preferred embodiment, the spacer consists of at least two elastic shaped metal bodies, with the shaped metal bodies contacting each other in the plane between the substrates, transverse to this plane.

Both are preferably configured identically, with the one shaped metal body most preferably connected to the semiconductor by sintering and with the other shaped metal body connected to the other substrate by sintering.

The distance between the surface of the first substrate and the surface of the second substrate is preferably in the range of 0.8 mm to 2 mm.

A particularly advantageous embodiment is obtained when the semiconductor is at least partly made of silicon carbide (SiC).

Finally, a method for producing a semiconductor module is proposed, with the following steps:
Disposing a semiconductor between two substrates,
Disposing an elastic shaped metal body between the substrates to produce a predefined distance between the substrates, and
Connecting the substrates, the shaped metal body and the semiconductor with each other.

According to a preferred embodiment of the process, a direct first electrical connection between the one substrate and the semiconductor and a second electrical connection mediated by the elastic shaped metal body are formed between the semiconductor and the other substrate. The connection is particularly made by means of sintering.

In an alternative embodiment of the process, the connection may be made by means of nanowires as described above.

BRIEF DESCRIPTION OF THE DRAWINGS

The invention is explained in greater detail below with reference to a particularly preferred embodiment shown in the attached drawings, in which.

DETAILED DESCRIPTION

Figure 1:
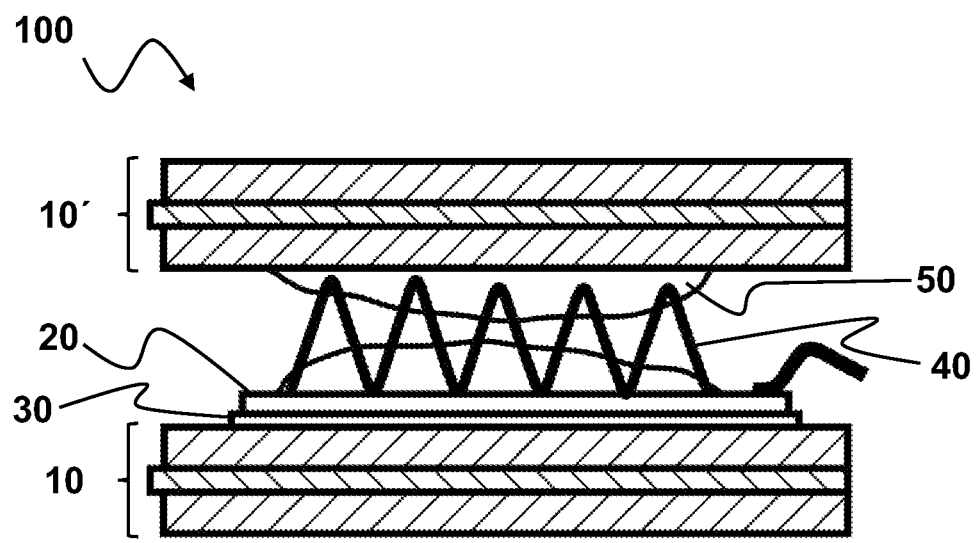
FIG. 1 shows a side view of a preferred example embodiment of the invention.

FIG. 1 shows a side view of a preferred exemplary embodiment of the invention.

FIG. 1 in particular shows a semiconductor module 100 with a first substrate 10, a second substrate 10' and a spacer 40, which is designed as an elastic shaped metal body, all distanced from one another by the substrates 10, 10' and simultaneously electrically contacting the substrates 10, 10'. The wave-shaped spacer 40 has a thickness of about 0.8 to about 2 mm.

The waveform of the spacer 40, which is similar to a meander in cross-section, provides for increased elastic behavior in at least one axis. A geometric relief can be realized by means of further structural measures in a further axis parallel to the surface of a semiconductor 20 disposed between the substrates 10, 10'. A "spacer" is thus obtained which, due to its elastic properties in the lateral plane, transmits only small thermomechanical stresses to the semiconductor, despite a considerable thickness of about 0.8 to 2 mm inclusively.

If the spacers 40 are elastically deformable in one direction in the plane of the semiconductor 20, a plurality of spacers 40, which are aligned in the same direction with respect to an elastic deformation, may be provided in a semiconductor module 100.

Figure 2:
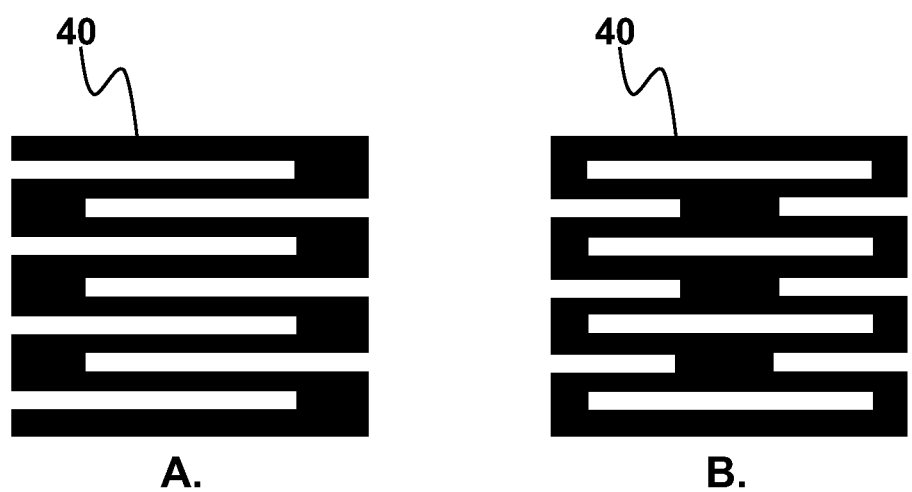
FIG. 2 shows a top view of two examples of particularly preferred spacers.

However, it is particularly preferred, as FIG. 2 shows, for the spacers 40 to be slotted transversely to the course of the wavy structure. This configuration not only allows for an elastic deformation in the direction of the wave crests and wave troughs of the elastically designed spacer, but also transversely to the direction of the waves.

Figure 3:
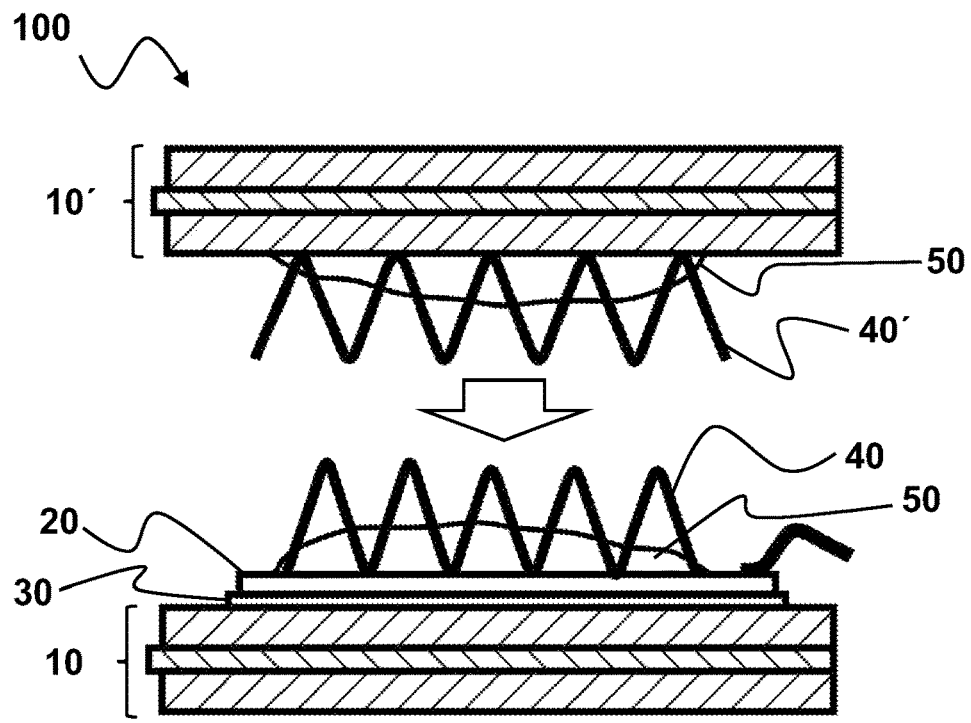
FIG. 3 shows a side view of a preferred second exemplary embodiment of the invention.

If the distance between the upper substrate 10' and the surface of the semiconductor 20 is too large, as shown in FIG. 3, two spacers 40, 40' may also be used.

When assembling the lower substrate 10 and the upper substrate 10' equipped with semiconductor 20, the waveform of the spacer 50 is deformed both in the vertical direction and in the lateral direction. The tips of the "wave crests" then glide over the surfaces to be contacted and perform a cleaning effect. It is, above all, possible to thus break open oxide layers of aluminum semiconductor metallizations. This leads to an electrically and thermally highly conductive connection to the semiconductor 20, without the latter necessarily having to be coated with a noble metal surface.

These wave-shaped shaped metal bodies used as spacers 40 can be simply placed in a wet sintering paste 50 applied to the semiconductor surface in a rapid assembly process. The semiconductor has already been firmly and reliably connected to the substrate 10 (or a lead frame) by means of the connection layer 30 in an upstream hydrostatic sintering process. The upper substrate 10' (or a lead frame) also carries along a silver paste deposit 50. The upper substrate 10' is then aligned and merged with the lower substrate 10. As a result, the contact with the spacers 40 is closed despite a notable distance of 0.8 to 2 mm.

This technology is particularly advantageous for fast switching SiC modules because they can take advantage of the highly reliable sintered connection in a sandwich structure.

Alternatively, the semiconductor 20 and the spacer 4o can be connected using electrically conducting nanowires. Such nanowires are grown from one or more of the surfaces to be connected, and then the surfaces are brought together. The joining takes place under compression and possibly with a raised temperature. However, the technique is admirably suited to the current invention, since it can successfully be used with relatively low pressures, thus enabling the connection of components utilizing the spacer 40 without damaging the elastic properties of the spacer 40. The pressure used for bonding may be up to 70 MPa, but in some situations it may be as low as 1 MPa. The nanowires may typically comprise copper or gold, nickel, silver, platinum, or other suitable metals. Typically they may have a diameter of between 30 nm and 2 μm and have a length of between 500 nm and 50 μm. A potential great advantage of the use of nanowires, is that the joint formed is flexible, and thus the stresses around the items being joined, such as a semiconductor chip or a substrate, is reduced. This in turn leads to much improved reliability and module life.

Figure 4:
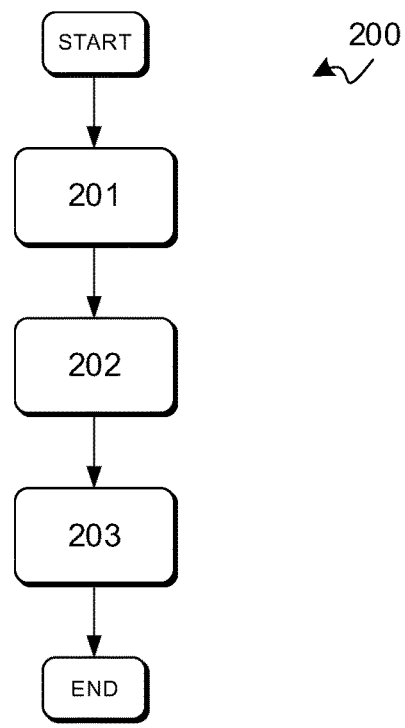
FIG. 4 shows a flow chart of the inventive method.

FIG. 4 shows a flow chart of the inventive method 200 for producing a semiconductor module. The method 200 comprises the following steps:
Disposing 201 a semiconductor between two substrates,
Disposing 202 an elastic shaped metal body between the substrates to produce a predefined distance between the substrates, and Connecting 203 the substrates, the shaped metal body and the semiconductor with each other.

Figure 5:
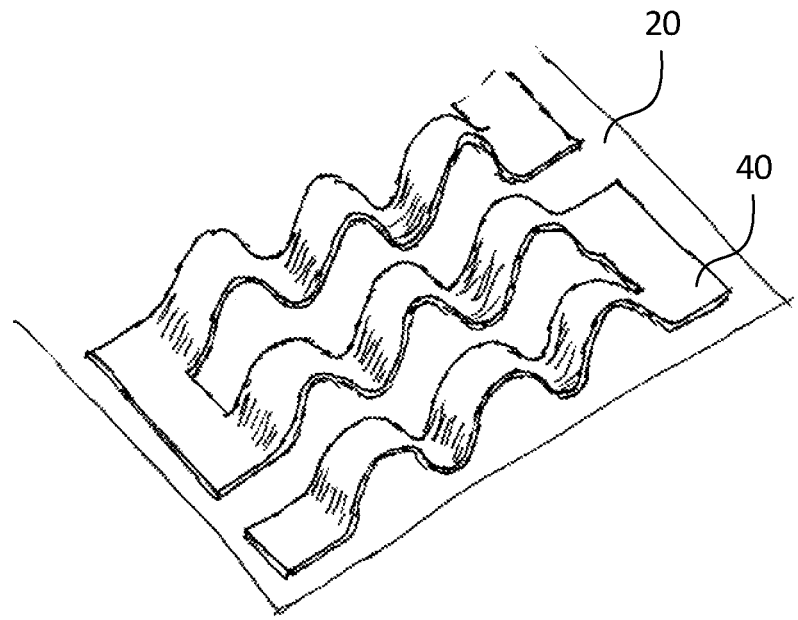
FIG. 5 is a drawing illustrating further details of the embodiment shown in FIG. 2.

FIG. 5 is a drawing illustrating further details of the embodiment shown in the top (plan) view of FIG. 2. In this orthogonal view can been seen a spacer 40 comprising a shaped metal body which is wave-shaped in sections. The spacer 40 is connected to the upper surface of a semiconductor 20.

Figure 6:
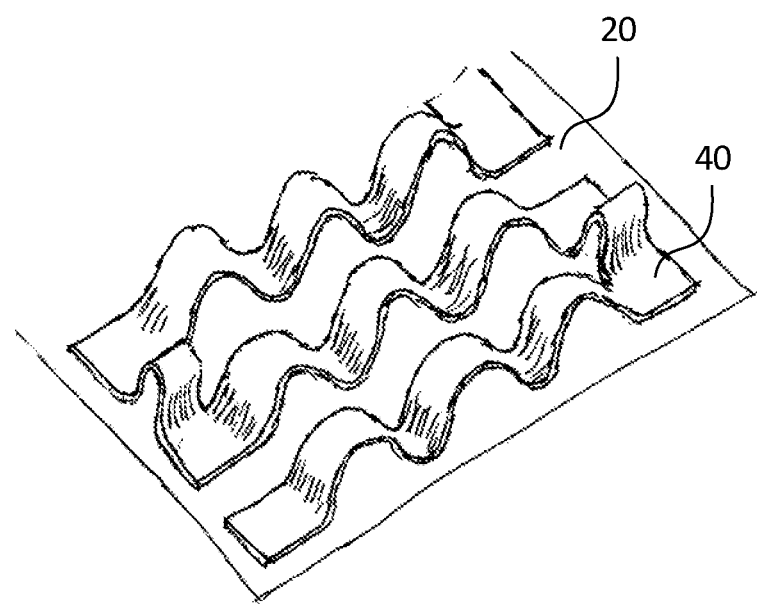
FIG. 6 is a drawing illustrating further details of an alternative realization of the embodiment shown in FIG. 2.

FIG. 6 is a drawing illustrating further details of an alternative realization of the embodiment shown in the top (plan) view of FIG. 2. In this orthogonal view can been seen a spacer 40 comprising a shaped metal body which is wave-shaped in sections. The spacer 40 is connected to the upper surface of a semiconductor 20. In this embodiment, additional wave shapes are included orthogonal to those shown in FIG. 5. Such orthogonal sections increase the flexibility of the spacer 40 in the orthogonal direction.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A semiconductor module having a first substrate, a second substrate and a spacer disposed in a plane separating the substrates from each other,
    wherein a semiconductor is disposed between the first substrate and the second substrate,
    wherein the spacer is formed by at least a first elastic wave-shaped metal body and a second elastic wave-shaped metal body,
    wherein the first and second wave-shaped metal bodies are at least partially stacked in a direction transverse to the plane separating the substrates, and
    wherein one wave-shaped metal body is connected to the semiconductor while the other wave-shaped metal body is connected to one of the first or second substrate.

2. The semiconductor module according to claim 1, wherein the semiconductor is firmly bonded to one of the first or the second substrate.

3. The semiconductor module according to claim 1, wherein the spacer electrically connects the semiconductor with the other of the substrates.

4. The semiconductor module according to claim 1, wherein the first substrate and/or the second substrate is a direct copper bonding substrate.

5. The semiconductor module according to claim 1, wherein at least one of the first or second shaped metal body is made to be elastic so that the application of pressure in a first direction causes an expansion in a second direction.

6. The semiconductor module according to claim 5, wherein the spacer includes a plurality of shaped metal bodies oriented in different directions with respect to each other.

7. The semiconductor module according to claim 1, wherein the spacer is configured to yield laterally when pressure from a substrate acting in the direction of the semiconductor is applied substantially vertically to the semiconductor.

8. The semiconductor module according to claim 1, wherein the shaped metal body connected to the semiconductor is disposed on the semiconductor in a planar way in the plane between the substrates.

9. The semiconductor module according to claim 1, wherein at least one of the first or second shaped metal body is configured to have crests and troughs extending in a first direction of the plane separating the substrates.

10. The semiconductor module according to claim 1, wherein at least one of the first or second shaped metal body is slotted.

11. The semiconductor module according to claim 9, wherein at least one of the first or second shaped metal body is slotted transversely to the bent, folded or wavy configuration first direction.

12. The semiconductor module according to claim 1, wherein deflected portions of the shaped metal bodies which contact the semiconductor and the other substrate are made to be electrically contacting.

13. The semiconductor module according to claim 1, wherein at least one of the first or second shaped metal body is a film.

14. The semiconductor module according to claim 1, wherein at least one of the first or second shaped metal bodies is connected to the semiconductor or to the other substrate by sintering.

15. The semiconductor module according to claim 1, wherein the first and second shaped metal bodies are connected to each other transversely to the plane separating the substrates.

16. The semiconductor module according to claim 15, wherein the two shaped metal bodies are of identical design.

17. The semiconductor module according to claim 1, wherein one shaped metal body is connected to the semiconductor by sintering while the other shaped metal body is connected to the other substrate by sintering.

18. The semiconductor module according to claim 1, wherein one shaped metal body is connected to the semiconductor by sintering while the other shaped metal body is connected to the other substrate by nanowires.

19. The semiconductor module according to claim 1, wherein the distance between the surface of the first substrate and the surface of the second substrate is in the range of 0.8 mm to 2 mm.

20. The semiconductor module according to claim 1, wherein the semiconductor is at least partly made of silicon carbide (SiC).

21. A method for producing a semiconductor module, characterized by the following steps:
    disposing a semiconductor between two substrates,
    disposing a spacer comprising a first elastic wave-shaped metal body and a second elastic wave-shaped body between the substrates, wherein the first and second wave-shaped bodies are at least partially stacked in a direction transverse to a plane separating the substrates to produce a predefined distance between the substrates, and
    connecting the substrates, the first and second wave-shaped bodies and the semiconductor to each other.

22. The method of claim 21, wherein establishing a first direct electrical connection between one substrate and the semiconductor and a second electrical connection between the semiconductor and the other substrate is conveyed through the spacer.

23. The method according to claim 21, wherein the connecting takes place by means of sintering.

24. The method according to claim 21, wherein the connecting takes place by means of nanowires.

* * * * *

UNITED STATES PATENT AND TRADEMARK OFFICE
CERTIFICATE OF CORRECTION

| | |
|---|---|
| PATENT NO. | : 12,125,817 B2 |
| APPLICATION NO. | : 17/608856 |
| DATED | : October 22, 2024 |
| INVENTOR(S) | : Martin Becker et al. |

It is certified that error appears in the above-identified patent and that said Letters Patent is hereby corrected as shown below:

In the Claims

Claim 11, at Column 6, Lines 10-11, "is slotted transversely to the bent, folded or wavy configuration first direction." should read as --is slotted transversely to the first direction.--

Signed and Sealed this
Third Day of December, 2024

Katherine Kelly Vidal
*Director of the United States Patent and Trademark Office*